United States Patent
Kurita et al.

(10) Patent No.: US 6,840,430 B2
(45) Date of Patent: *Jan. 11, 2005

(54) BOARD PIECES, FLEXIBLE WIRING BOARDS AND PROCESSES FOR MANUFACTURING FLEXIBLE WIRING BOARDS

(75) Inventors: Hideyuki Kurita, Yokohama (JP); Masanao Watanabe, Kanuma (JP); Toshihiro Shinohara, Kanuma (JP); Mitsuhiro Fukuda, Kanuma (JP); Yukio Anzai, Kanuma (JP)

(73) Assignee: Sony Chemicals, Corp., Tokyo (JP)

( * ) Notice: Subject to any disclaimer, the term of this patent is extended or adjusted under 35 U.S.C. 154(b) by 44 days.

This patent is subject to a terminal disclaimer.

(21) Appl. No.: 10/458,175

(22) Filed: Jun. 10, 2003

(65) Prior Publication Data

US 2003/0211234 A1 Nov. 13, 2003

Related U.S. Application Data (62) Division of application No. 09/937,590, filed as application No. PCT/JP00/00443 on Jan. 28, 2000, now Pat. No. 6,596,547.

(51) Int. Cl.$^7$ ............................................... B21D 39/00
(52) U.S. Cl. ..................... 228/173.2; 228/208; 428/347
(58) Field of Search ...................... 428/347; 228/173.2, 228/208, 110.1

(56) References Cited

U.S. PATENT DOCUMENTS

| | | | | | |
|---|---|---|---|---|---|
| 5,296,649 | A | * | 3/1994 | Kosuga et al. | ............... 174/250 |
| 5,714,252 | A | * | 2/1998 | Hogerton et al. | ............ 428/344 |
| 6,280,828 | B1 | * | 8/2001 | Nakatsuka et al. | .......... 428/209 |
| 6,395,993 | B1 | * | 5/2002 | Nakamura et al. | ........... 174/254 |
| 6,437,251 | B1 | * | 8/2002 | Kurita et al. | ................ 174/254 |
| 6,596,947 | B1 | * | 7/2003 | Kurita et al. | ................ 174/255 |

* cited by examiner

*Primary Examiner*—Cathy F. Lam
(74) *Attorney, Agent, or Firm*—Osha & May L.L.P.

(57) ABSTRACT

A board piece 2 of the present invention comprises a non-thermoplastic resin film 11, a thermoplastic resin film 10 formed on the non-thermoplastic resin film 11 and a metal wiring 8 formed on the surface of the thermoplastic resin film 10. Metal wiring 8 is partially exposed on board piece 2 to form a contact 12. A low-melting metal coating 13 is formed on contact 12 and two board pieces 2a, 2b are pressed against each other under heating with contacts 12a, 12b thereof being in contact with each other so that thermoplastic resin films 10a, 10b soften to adhere board pieces 2a, 2b to each other and low-melting metal coatings 13a, 13b melt and then solidify to connect contacts 12a, 12b to each other. The region of metal wiring 8 not used for connection is wiring 17 connecting contacts 12 to each other and a cover film 19 can be provided on the surface thereof. Contacts 12a, 12b can also be connected by applying ultrasonic wave.

16 Claims, 9 Drawing Sheets

BOARD PIECES, FLEXIBLE WIRING BOARDS AND PROCESSES FOR MANUFACTURING FLEXIBLE WIRING BOARDS

CROSS REFERENCE TO RELATED APPLICATIONS

This application is a divisional of U.S. patent application Ser. No. 09/937,590, filed Sep. 27, 2001, now U.S. Pat. No. 6,596,547. Ser. No. 09/937,590 is a 371 of PCT/JP00/00443 filed on Jan. 28, 2000.

FIELD OF THE INVENTION

The present invention relates to the field of flexible wiring boards, particularly to the field of board pieces constituting flexible wiring boards and flexible wiring boards formed by assembling the board pieces.

PRIOR ART

Flexible wiring boards having a desired circuit pattern printed thereon have been widely used, and in recent years, there are demands for flexible wiring boards having various shapes suitable for the contours of the place where they are used.

Figure 10A:
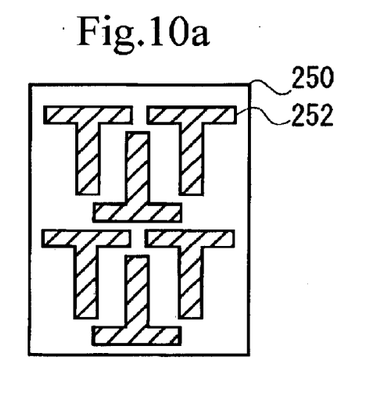

FIG. 10(a) shows a layout for cutting T-shaped flexible wiring boards 252 from a rectangular pre-cutted substrate 250, in which six flexible wiring boards 252 are obtained.

However, a significant part of pre-cutted substrate 250 is uselessly discarded when such shaped flexible wiring boards 252 are cut.

Thus, a technique for preparing a flexible wiring board in a complex shape was proposed by dissolving the complex shape into simple shapes and assembling board pieces in the simple shapes. Reference 255 in FIG. 10(c) represents a flexible wiring board having the same shape as that of flexible wiring board 252 described above and formed by assembling two rectangular board pieces 253, 254.

Figure 10B:
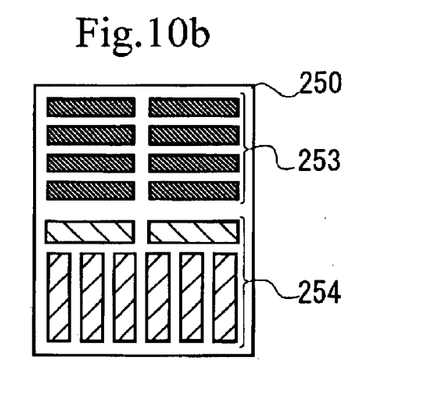
Figure 10C:
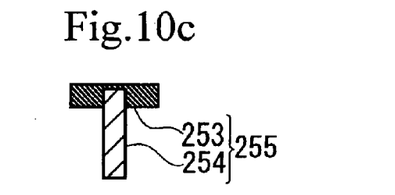

When rectangular board pieces 253, 254 are used in this manner, a close layout can be achieved as shown in FIG. 10(b) and therefore, pre-cutted substrate 250 can be effectively used by cutting board pieces 253, 254 in simple shapes. In FIG. 10(b), eight board pieces each 253, 254 are obtained and assembled into eight flexible wiring boards 256. As shown in this example, a greater number of flexible wiring boards 256 can be obtained by using board pieces in simple shapes than directly cutting T-shaped flexible wiring boards 252.

When a plurality of board pieces are assembled into a flexible wiring board as described above, board pieces 253, 254 must be mechanically and electrically assembled.

Figure 11A:
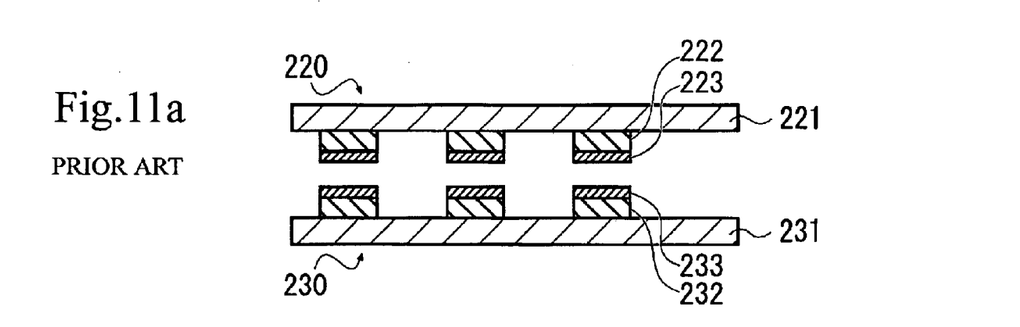
Figure 11B:
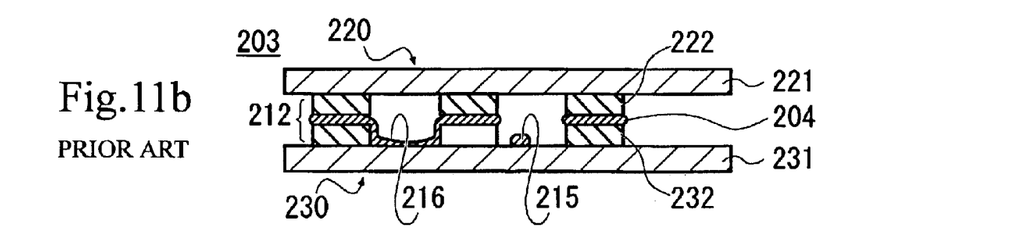

An example of the assembling technique is explained with reference to FIGS. 11(a), 11(b), in which references 220, 230 represent board pieces having metal wirings 222, 232 consisting of a patterned copper thin film formed on polyimide films 221, 231, respectively. In order to assemble these board pieces 220, 230, boards elements 220, 230 are first opposed to each other with metal wirings 222, 232 facing each other.

Metal wirings 222, 232 have solder coatings 223, 233 formed by plating on their surfaces, respectively, and solder coatings 223, 233 of the respective board pieces 220, 230 are brought into close contact with each other and heat and pressure are applied to melt solder coatings 223, 233, which are then cooled to form a solder layer 204. This solder layer 204 forms a metallic bond with metal wirings 222, 232, whereby metal wirings 222, 232 are firmly connected to each other via solder layer 204 to give a flexible wiring board 203 (FIG. 11(b)).

However, the recent need for forming a large number of metal wirings on a small-area flexible wiring board leads to an increasingly narrower pitch between metal wirings 222 (or metal wirings 232) on the same board piece 220, 230.

When solder coatings 223, 233 are heated under pressure as described above, molten solder scatters and remains here and there as scatter 215 in flexible wiring board 203, and in extreme cases, molten solder flows out to form a bridge 216 at connection 212 between metal wirings 222, 232, which causes a short circuit between metal wirings 222 (or metal wirings 232) to be insulated.

As the pitch between metal wirings 222 (or metal wirings 232) becomes narrower, bridge 216 becomes more likely to occur. Especially when a plurality of board pieces are to be assembled into a flexible wiring board, even one short circuit at the connection between board pieces means a faulty flexible wiring board as a whole, which extremely lowers the manufacturing yield of flexible wiring boards.

DISCLOSURE OF THE INVENTION

A board piece of the present invention comprises a non-thermoplastic resin film, a thermoplastic resin film formed on the non-thermoplastic resin film and a metal wiring formed on the surface of the thermoplastic resin film.

In this board piece, the metal wiring can be partially covered with a resin film.

The metal wiring can also be partially exposed.

A low-melting metal coating can be formed on at least a part of the exposed metal wiring.

A solder can be used as a material for the low-melting metal coating.

A gold coating can also be formed on at least a part of the exposed metal wiring.

The non-thermoplastic resin film can consist of a polyimide film.

The thermoplastic resin film can consist of a thermoplastic polyimide film.

A flexible wiring board of the present invention comprises at least two board pieces each having a non-thermoplastic resin film, a thermoplastic resin film formed on the non-thermoplastic film and a metal wiring formed on the surface of the thermoplastic resin film, wherein the board pieces are adhered to each other via the thermoplastic resin films by heating the metal wirings of the board pieces in contact with each other to soften the thermoplastic resin films and insert them between connections of the metal wirings in contact with each other.

In the flexible wiring board, a low-melting metal coating can be formed on the surface of at least one of the metal wirings in contact with each other so that the board pieces are heated to melt the low-melting metal coating, which then solidifies to connect the metal wirings to each other.

The metal wirings in contact with each other can also be connected by ultrasonic wave vibration.

In this case, a gold coating is preferably formed on at least one of the metal wirings to be connected by ultrasonic wave vibration.

Another flexible wiring board of the present invention is formed by assembling at least three board pieces each having a resin film and a metal wiring, wherein the metal wirings of a first and second board pieces among the board pieces are partially connected and fixed to the metal wiring of a third board piece and a thermoplastic resin is filled between the connecting and fixing regions of the metal wirings while the other regions of the metal wirings are partially covered with a protective film on their surfaces and partially exposed.

In the flexible wiring board, the resin film of at least one of the board pieces to be assembled has a multilayer structure consisting of a non-thermoplastic resin film and a thermoplastic resin film and the metal wiring can be formed on the thermoplastic resin film.

The board pieces can be connected to each other by applying a thermoplastic resin film on each of the metal wirings and then assembling the board pieces with a thermoplastic resin constituting the thermoplastic resin film being filled between the connecting regions of the metal wirings.

The metal wirings can be fixed to each other with a solder.

An opening can be formed in the protective film provided on at least one of the first to third board pieces.

In a process for manufacturing a flexible wiring board of the present invention by assembling a plurality of board pieces having a resin film and a metal wiring provided on the resin film, the resin film of at least one of the board pieces to be assembled has a multilayer structure consisting of a non-thermoplastic resin film and a thermoplastic resin film and the metal wiring is provided on the thermoplastic resin film and the board pieces to be assembled are pressed against each other under heating.

In this case, the metal wirings of the board pieces can be connected to each other by forming a low-melting metal coating on the surface of the metal wiring of at least one of the board pieces to be assembled and pressing the board pieces against each other under heating to melt the low-melting metal coating.

The board pieces can be assembled by pressing the board pieces against each other under heating after applying ultrasonic wave to the board pieces in a superposed state to connect the metal wirings of the board pieces to each other by vibration energy of the ultrasonic wave.

The board pieces can also be assembled by pressing the board pieces in a superposed state against each other under heating while applying ultrasonic wave to connect the metal wirings to each other by vibration energy of the ultrasonic wave.

In this case, a gold coating is preferably formed in advance on the surface of at least one of the metal wirings to be connected.

In another process for manufacturing a flexible wiring board of the present invention by assembling a plurality of board pieces having a resin film and a metal wiring provided on the resin film, the metal wirings of the board pieces are connected to each other by providing a thermoplastic resin film between the metal wirings of the board pieces to be assembled and pressing the board pieces against each other under heating to force the metal wirings into the thermoplastic resin film.

In this case, the metal wirings of the board pieces can be connected to each other by forming a low-melting metal coating on the surface of the metal wiring of at least one of the board pieces to be assembled and pressing the board pieces against each other under heating to melt the low-melting metal coating.

BRIEF DESCRIPTION OF THE DRAWINGS

FIGS. 1(a)–(h) is a diagram for illustrating a first example of flexible wiring board of the present invention and a manufacturing process thereof.

FIGS. 2(a), (b) is a diagram for illustrating a variation of the first example of flexible wiring board of the present invention and a manufacturing process thereof.

FIGS. 4(a)–(d) is a diagram for illustrating a second example of flexible wiring board of the present invention and a manufacturing process thereof.

FIGS. 5(a)–(d) is a diagram for illustrating a third example of flexible wiring board of the present invention and a manufacturing process thereof.

FIGS. 6(a)–(e) is a diagram for illustrating a fourth example of flexible wiring board of the present invention and a manufacturing process thereof.

FIGS. 7(a)–(d) is a diagram for illustrating a fifth example of flexible wiring board of the present invention and a manufacturing process thereof.

FIGS. 8(a)–(e) is a diagram for illustrating a sixth example of flexible wiring board of the present invention and a manufacturing process thereof.

FIGS. 9(a)–(c) is a diagram for illustrating an example of a layout of board pieces.

FIGS. 10(a)–(c) is a diagram for illustrating a layout of board pieces and flexible wiring boards.

FIGS. 11(a), (b) is a diagram for illustrating disadvantages of an assembling technique of the prior art.

THE MOST PREFERRED EMBODIMENTS OF THE INVENTION

The present invention was made to overcome the above disadvantages of the prior art with the purpose of providing a technique for assembling a plurality of board pieces to give a shaped flexible wiring board with high reliability and high durability.

Board pieces and flexible wiring boards of the present invention will now be explained as well as manufacturing processes of flexible wiring boards with reference to the attached drawings.

FIGS. 1(a)–(h) shows a process for manufacturing a first example of flexible wiring board of the present invention.

Figure 1A:
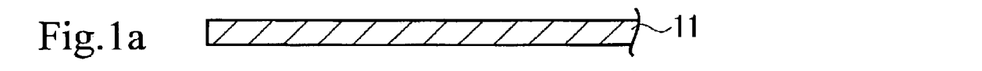
Figure 1B:
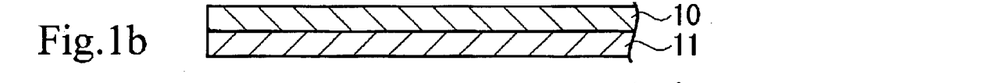

Referring FIGS. 1(a) and 1(b), a thermoplastic resin film 10 consisting of a thermoplastic polyimide synthesized from an aliphatic amine and an acid anhydride and a non-thermoplastic resin film 11 consisting of a non-thermoplastic polyimide synthesized from an aromatic amine and an acid anhydride are first prepared.

Figure 1C:
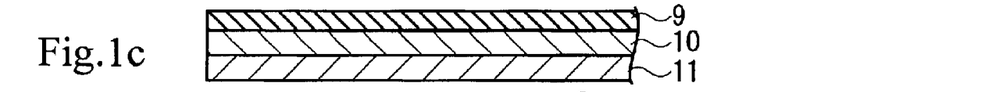

An adhesive layer (not shown with a release paper applied thereon) is formed on each side of thermoplastic resin film 10 (preferably having a thickness of 15 $\mu$m–50 $\mu$m and here consisting of a polyimide film having a thickness of 25 $\mu$m) and the adhesive layer on one side is exposed, and thermoplastic resin film 10 is applied on non-thermoplastic resin film 11 (preferably having a thickness of 10 $\mu$m–50 $\mu$m and here consisting of a polyimide film having a thickness of 25 $\mu$m available from DuPont under trade name Kapton) (FIG. 1(b)), and then the other adhesive layer is exposed and a metal foil 9 (preferably having a thickness of 5 $\mu$m–75 $\mu$m and here consisting of a copper foil having a thickness of 18 $\mu$m) is applied on the surface of thermoplastic resin film 10 (FIG. 1(c)).

Figure 1D:
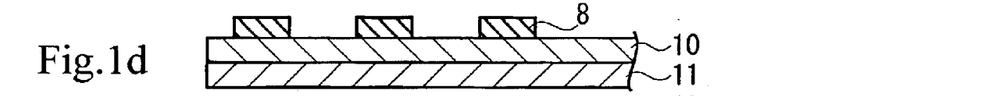

Then, metal foil 9 is patterned by a photolythographic process using a photosensitive dry film or a resist film to form a metal wiring 8 consisting of copper (FIG. 1(d)). Metal wiring 8 typically has a pattern width of about 100 $\mu$m with a pitch of about 10 $\mu$m–200 $\mu$m, here 200 $\mu$m (0.2 mm).

This metal wiring 8 has a wide contact for connecting board pieces to each other to form a flexible wiring board or, after a flexible wiring board has been prepared, for connecting the flexible wiring board to an electric component such as a semiconductor device or an electronic circuit. It also has an elongate wiring for electrically connecting contacts via metal wiring 8.

Figure 1E:
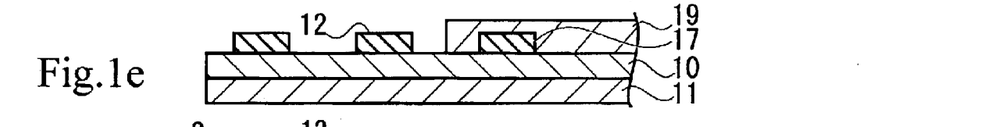

In FIG. 1(e), reference 12 represents the contact and reference 17 represents the wiring. After metal wiring 8 is formed and surface-cleaned, a cover film 19 is applied on wiring 17 while contact 12 is exposed as shown in FIG. 1(e).

Figure 1F:
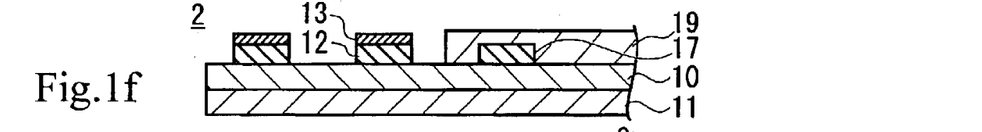

The assembly is immersed in a plating solution of a low-melting metal (here, a solder of Sn:Pb=6:4) to form a low-melting metal coating 13 on the top of contact 12, whereby a board piece 2 is obtained (FIG. 1(f)). Preferably, low-melting metal coating 13 has a thickness of 1 $\mu$m–10 $\mu$m. The thickness here is 3 $\mu$m.

Figure 1G:
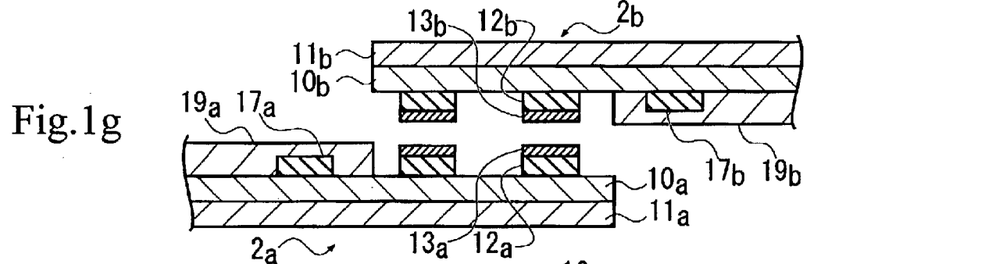

Then, two board pieces 2a, 2b having the structure described above are prepared and their contacts 12a, 12b are opposed (FIG. 1(g)) and heat and pressure are applied while low-melting metal coatings 13a, 13b on the tops of contacts 12a, 12b are in close contact with each other (thermal compression bonding). As an example, thermal compression bonding conditions involve a heating temperature of 150–300° C. at a pressure of 20–50 kg/cm$^2$ for 10–20 seconds, and here 200° C. at 30 kg/cm$^2$ for 10 seconds.

During thermal compression bonding of board pieces 2a, 2b, thermoplastic resin films 10a, 10b and contacts 12a, 12b are first heated via non-thermoplastic films 11a, 11b and thermoplastic resin films 10a, 10b heat up and soften.

Thermoplastic resin films 10a, 10b located between contacts 12a (and between contacts 12b) are not in contact with each other before heating, but they are flown out and inserted between contacts 12a (and between contacts 12b) as they soften.

After thermoplastic resin films 10a, 10b soften, the temperature of contacts 12a, 12b rises, and when it reaches the melting point of the low-melting metal or more, low-melting metal coatings 13a, 13b melt. At that time, melts of low-melting metal coatings 13a, 13b cannot scatter or flow out to form a bridge by molten solder because softened thermoplastic resin films 10a, 10b are filled between contacts 12a (and between contacts 12b) in board pieces 2a, 2b of the present invention.

When cooling after thermal compression bonding, two molten low-melting metal coatings 13a, 13b combine to form a low-melting metal coating 14. Contacts 12a, 12b and low-melting metal coating 14 combine to form connection 16 (FIG. 1(h)).

Figure 1H:
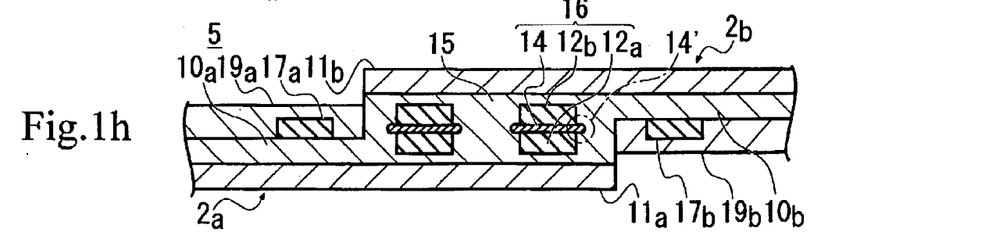

Copper on the surfaces of contacts 12a, 12b forms a metallic bond with low-melting metal coating 14 so that two board pieces 2a, 2b are electrically and mechanically connected via connection 16. Around this connection 16 is formed a flange 14' protruding from low-melting metal coating 14.

When cooling after the end of compression bonding, two softened thermoplastic resin films 10a, 10b also combine to form a thermoplastic resin film 15. As thermoplastic resin films 10a, 10b develop adhesiveness when then soften, two non-thermoplastic resin films 11a, 11b are adhered to each other via single layer thermoplastic resin film 15 to give a first example of flexible wiring board 5 of the present invention. In this flexible wiring board 5, wirings 17a, 17b of two board pieces 2a, 2b adhered are covered with cover films 19a, 19b, respectively.

Although boards elements 2a, 2b described above both have contacts 12a, 12b formed on thermoplastic resin films 10a, 10b, either one board piece may have a contact formed on the thermoplastic resin film.

Figure 2A:
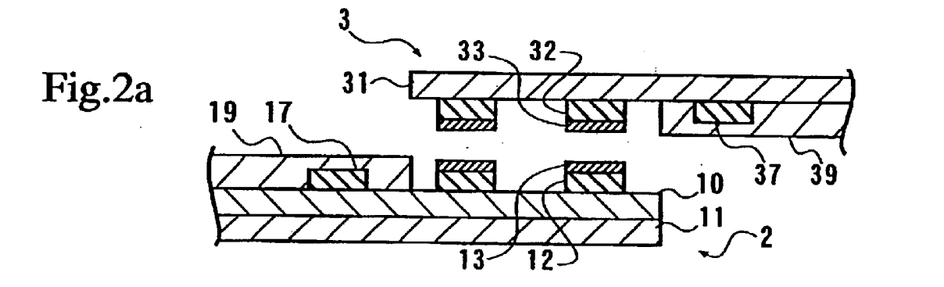

For example, a flexible wiring board can be prepared by assembling a board piece represented by reference 3 in FIG. 2(a) and a board piece represented by reference 2 in FIG. 1. Board piece 3 in FIG. 2(a) has a contact 32 and a wiring 37 consisting of a metal wiring formed on a non-thermoplastic resin film 31.

Figure 2B:
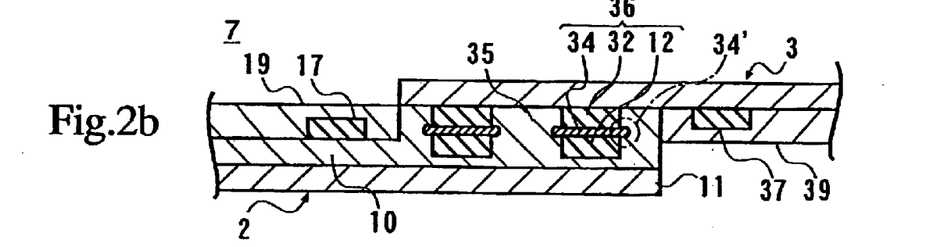

Also in this case, low-melting metal coatings 13, 33 on the tops of contacts 12, 32 of two board pieces 2, 3 are first brought into contact with each other and heat and pressure are applied in this state to form a low-melting metal coating 34, whereby the low-melting metal coating 34 and contacts 12, 32 form a connection 36. Board pieces 2, 3 are mechanically and electrically connected via connection 36 to give a flexible wiring board represented by reference 7 in FIG. 2(b).

The low-melting metal neither scatters nor forms a bridge because low-melting metal coatings 13, 33 melt after thermoplastic resin film 10 of one board piece 2 softens to fill the gap between contacts 32 directly formed on non-thermoplastic resin film 31 of the other board piece 3.

Although each of board pieces 2 (2a, 2b) and 3 used for assembly described above and board pieces described below has metal wiring 8 formed on one side, a metal wiring may be formed on each side.

Although non-thermoplastic resin films 11 (11a, 11b), 31 and thermoplastic resin film 10 (10a, 10b) described above are polyimide resin films, the present invention is not limited thereto. In the case of board pieces 2 (2a, 2b) and 3 described above and board pieces described below, thermoplastic resin films that cannot dissolve during thermal compression bonding but develop adhesiveness as they soften can be used. Resins for thermoplastic resin films are desirably polyimide resins from the viewpoint of chemical resistance and flame retardance.

When metal wirings are to be connected via a low-melting coating, the softening point of each of thermoplastic resin films 11 (11a, 11b) and 31 described above and thermoplastic resin films described below must be lower than the melting temperature of low-melting metal coatings 13, 33, but common thermoplastic resin films satisfy this condition.

Suitable low-melting metals for use in the present invention other than solders include tin series metals, bismuth series metals, etc. A corrosion resistant metal coating such as an oxidation resistant and corrosion resistant gold coating may be formed on the surfaces of low-melting metal coatings of the embodiments described above and below.

According to the present invention, the non-thermoplastic resin film of one of board pieces to be assembled and the non-thermoplastic resin film of the other board piece are adhered to each other via a thermoplastic resin film.

Therefore, a flexible wiring board of the present invention can also be formed by providing a contact on the surface of each metal wiring without forming a low-melting metal coating and applying heat and pressure while the contacts of board pieces are in contact, whereby the contacts are bonded to electrically connect metal wirings.

Metal wirings can also be ultrasonically connected.

Figure 3:
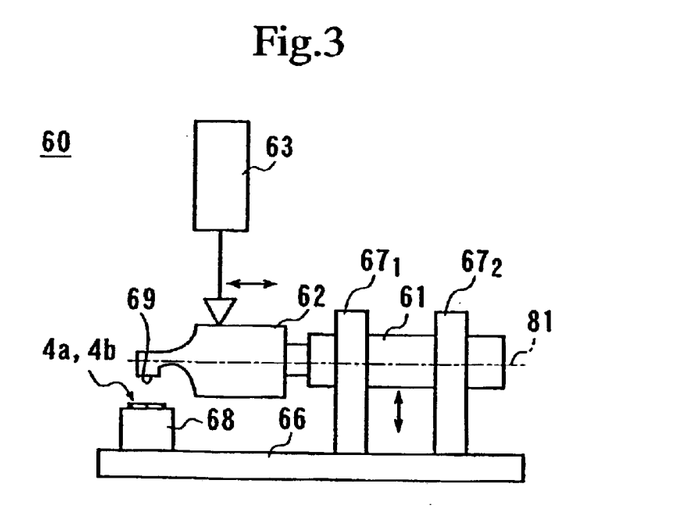
FIG. 3 shows an example of an ultrasonic wave apparatus used in a process of the present invention.

Reference 60 in FIG. 3 represents an ultrasonic wave apparatus used for ultrasonic wave connection. This ultrasonic wave apparatus 60 comprises a cylindrical ultrasonic wave generator 61, a resonator 62 transmitting ultrasonic wave vibration to an object, a platform 66 and two guides $67_1$, $67_2$.

In this ultrasonic wave apparatus 60, guides $67_1$, $67_2$ are upright almost perpendicularly on platform 66 and ultrasonic wave generator 61 is fitted to guide $67_1$, $67_2$ in a horizontal position to be vertically movable. Ultrasonic wave generator 61 is designed to rest at a desired position on guide $67_1$, $67_2$.

The base of resonator 62 is fitted to the tip end of ultrasonic wave generator 61. The tip end of resonator 62 is bent so that its surface is horizontal. Reference 69 represents such a horizontal surface of the tip end of resonator 62. Reference 81 represents the central axis of ultrasonic wave generator 61 and resonator 62, and the central axis 81 is designed to be horizontal together with the surface 69 of the tip end.

References 4a, 4b in FIGS. 4(a)–(d) represent board pieces to be worked by the ultrasonic wave apparatus 60.

These board pieces 4a, 4b have the same structure as that of board piece 2 shown in FIG. 1(e) except that low-melting metal coatings 13a, 13b are replaced with gold coatings 23a, 23b, and similar members are designated by similar references and not explained. A process for manufacturing a second example of flexible wiring board of the present invention using these board pieces 4a, 4b is explained below.

A workbench 68 having a flat upper surface is provided on platform 66 and two board pieces 4a, 4b are mounted on workbench 68 with gold coatings 23a, 23b formed on their contacts 12a, 12b being in contact with each other.

Then, an air cylinder 63 located above resonator 62 is activated so that ultrasonic wave generator 61 and resonator 62 vertically descend along guides $67_1$, $67_2$ until the surface 69 of the tip end of resonator 62 comes into contact with non-thermoplastic resin film 11b of board piece 4b.

Figure 4A:
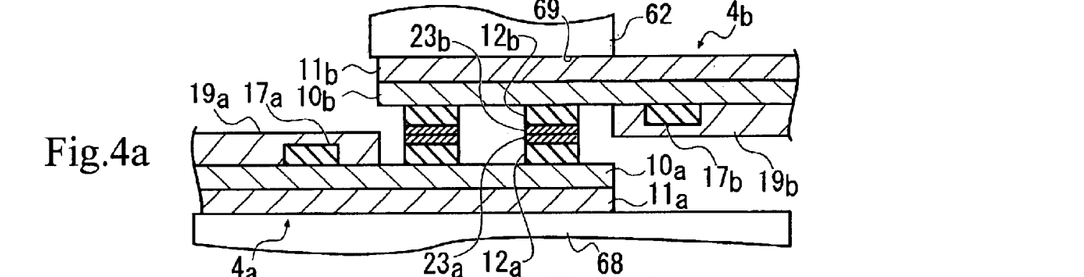

This state is shown in FIG. 4(a), and when ultrasonic wave generator 61 is activated, ultrasonic wave vibration generated from the ultrasonic wave generator 61 is transmitted to board pieces 4a, 4b via resonator 62.

The direction of ultrasonic wave vibration generated in ultrasonic wave generator 61 has almost no components vertical to the surface 69 of the tip end of ultrasonic wave generator 61 but consists of only components parallel to central axis 81 of ultrasonic wave generator 61.

As ultrasonic wave generator 61 is horizontally oriented, ultrasonic wave vibration is applied in the direction horizontal to the surfaces of board pieces 4a, 4b.

Figure 4B:
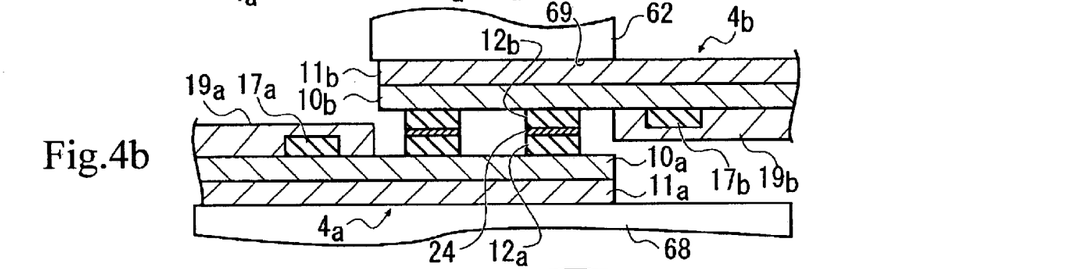

During then, board piece 4a directly mounted on workbench 68 remains fixed by frictional force against the surface of workbench 68. Thus, gold coatings 23a, 23b are slid on each other under ultrasonic wave vibration so that they are joined. This state is shown in FIG. 4(b), in which two gold coatings 23a, 23b are joined to form a single layer gold coating 24.

Reference 26 represents a connection for electrically connecting board pieces 4a, 4b. This connection 26 consists of gold coating 24 formed by ultrasonic wave connection and contacts 12a, 12b.

Then, ultrasonic wave generator 61 is stopped and then air cylinder 63 is activated so that resonator 62 and ultrasonic wave generator 61 ascend along guides $67_1$, $67_2$ to remove connected board pieces 4a, 4b from the top of workbench 68.

Then, board pieces 4a, 4b are mounted on another workbench 28 and a heat-generating member 29 is pressed against the part including gold coating 24 to heat thermoplastic resin films 10a, 10b, whereby thermoplastic resin films 10a, 10b heat up and soften and after cooling, a thermoplastic resin film 15 is formed. Thermoplastic resin films 10a, 10b enter into connection 26 when they are heated. Board pieces 4a, 4b are connected to each other via the resulting thermoplastic resin film 15 to give a second example of flexible wiring board 6 of the present invention (FIG. 4(c)).

If resonator 62 can be made to generate heat, resonator 64 is heated to a specific temperature and brought into contact with board pieces 4a, 4b superposed as shown in FIG. 4(a) and ultrasonic wave is applied under pressure so that ultrasonic wave is first applied between two metal coatings 23a, 23b to connect contacts 12a, 12b of board pieces 4a, 4b via metal coating 24 obtained by ultrasonic wave connection.

When ultrasonic wave application is terminated while resonator 62 remains in a pressed state, thermoplastic resin films 10a, 10b soften to give a second example of flexible wiring board 6 of the present invention in the same way as described above as shown in FIG. 4(d). In this case, board pieces 4a, 4b can be assembled via thermoplastic resin films 10a, 10b without moving them from the top of workbench 68 of ultrasonic wave apparatus 60.

Figure 4C:
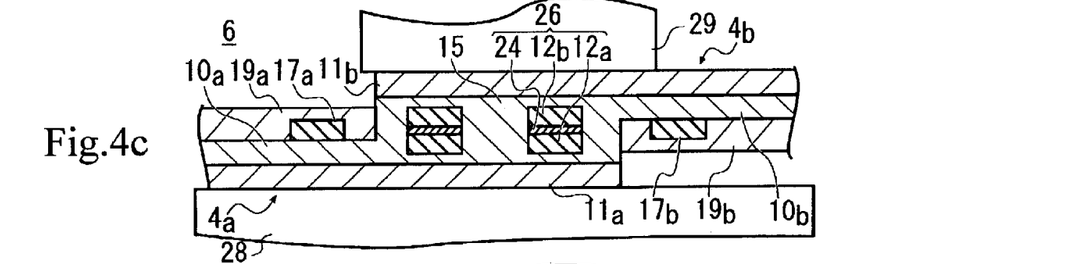
Figure 4D:
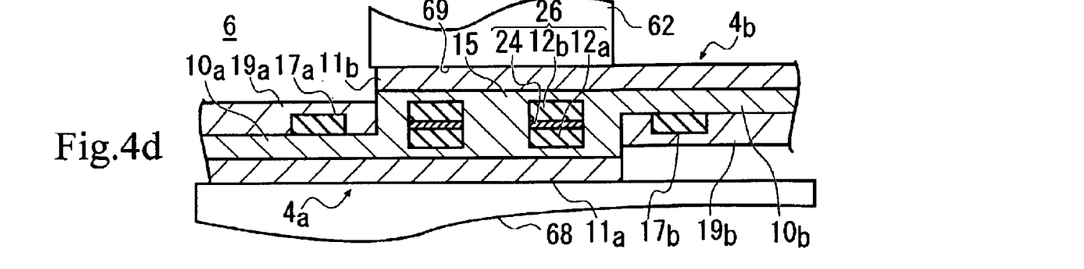

Although this second example of flexible wiring board 6 uses board pieces 4a, 4b having gold coatings 23a, 23b, gold coatings may be replaced with non low-melting coatings based on gold and further containing other metals. Platinum, silver and palladium coatings as well as non low-melting coatings based on these metals and further containing other metals may also be used.

Instead of using gold coatings or platinum coatings, board pieces 2a, 2b, 3 having low-melting metal coatings 13a, 13b, 33 such as board pieces 2a, 2b shown in FIG. 1 or board piece 3 shown in FIG. 2 can be used to ultrasonically connect low-melting metal coatings 13a, 13b, 33. In this case, a flexible wiring board can be prepared by applying heat and pressure after ultrasonic wave connection or by using a heated resonator for applying ultrasonic wave under heat and pressure. When ultrasonic wave is applied to board pieces 2, 3 shown in FIG. 2 under heat and pressure, the resonator of the ultrasonic wave apparatus should preferably be brought into contact with board piece 3 having a metal wiring (contact 32 and wiring 37) formed on non-thermoplastic resin film 31. When heat is applied after or during ultrasonic wave application, board pieces shown in FIGS. 5–8 can also be used.

Next, other examples of flexible wiring board of the present invention are explained together with manufacturing processes thereof with reference to the attached drawings.

Figures 9A, 9B:
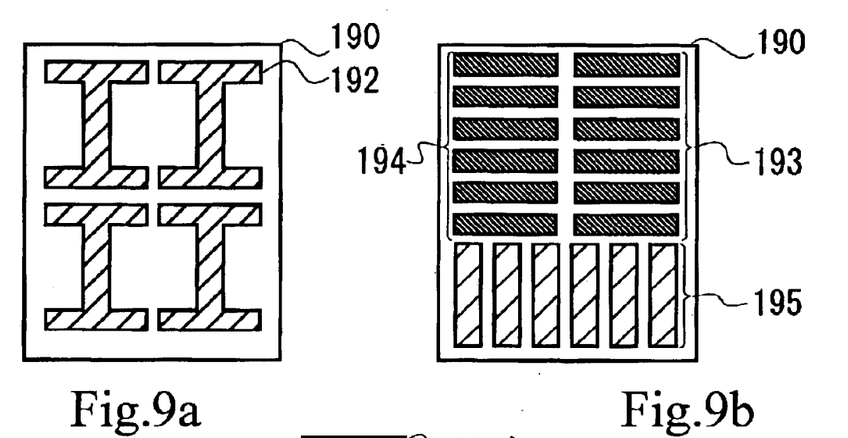

FIG. 9(a) shows a layout for cutting H-shaped flexible wiring boards 192 from a rectangular pre-cutted substrate 190, in which four flexible wiring boards 192 are obtained.

Figure 9C:
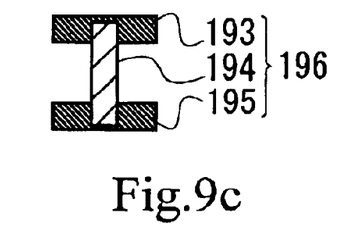

In contrast, three kinds of board pieces 193, 194, 195 can be closely arranged on pre-cutted substrate 190 according to the present invention as shown in FIG. 9(b). A flexible wiring board 196 shown in FIG. 9(c) can be prepared by cutting and assembling these three kinds of board pieces 193, 194, 195. With the layout of board pieces 193, 194, 195 in FIG. 9(b), six flexible wiring boards 196 can be obtained.

A process for assembling at least three board pieces 193, 194, 195 to form a flexible wiring board 192 as described above is explained below.

Figure 5A:
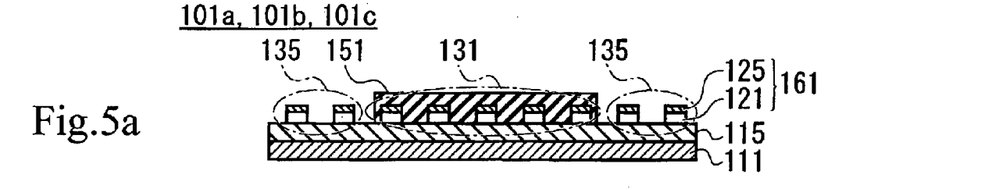
Figure 5B:
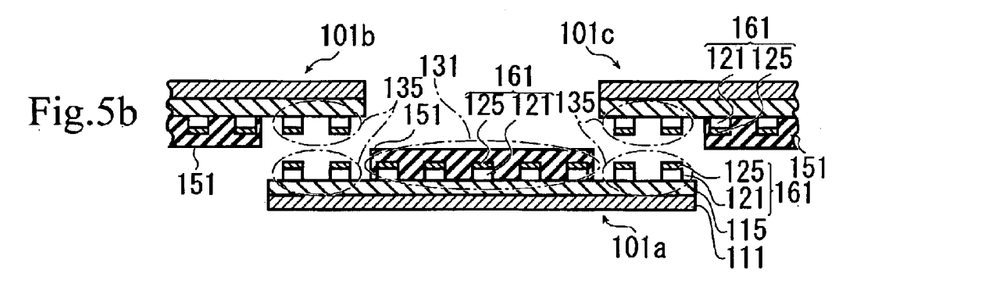
Figure 5C:
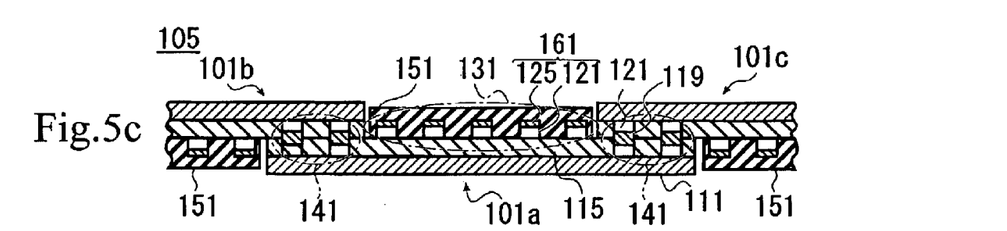
Figure 5D:
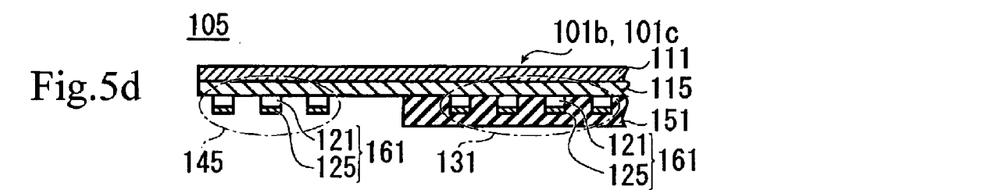

References 101a, 101b, 101c in FIGS. 5(a)–5(d) represent board pieces corresponding to the board pieces 193, 194, 195, and these board pieces 101a, 101b, 101c are assembled to form a third example of flexible wiring board 105 of the present invention (flexible wiring board represented by reference 105 in FIGS. 5(c), 5(d)) as follows.

Referring to FIG. 5(a), each of board pieces 101a, 101b, 101c has a multilayer resin film consisting of a non-thermoplastic resin film 111 and a thermoplastic resin film 115 formed on the non-thermoplastic resin film 111. On the surface of thermoplastic resin film 115 is formed a patterned metal wiring 161.

Non-thermoplastic resin film 111 consists of a polyimide film synthesized from an aromatic diamine and an acid anhydride, while thermoplastic resin film 115 consists of a polyimide film synthesized from an aliphatic amine and an acid anhydride.

Metal wiring 161 consists of a copper thin film 121 and a low-melting metal coating (solder coating) 125 formed on the copper thin film 121. On the top of metal wiring 125 of each board piece 101a, 101b, 101c, a polyamidic acid film before imidation is first formed and a photoresist is applied all over the surface, and then the photoresist is patterned by exposure and development and the polyamidic acid film is etched according to the pattern of the photoresist and imidated by heat treatment after removal of the photoresist to form a non-thermoplastic protective film 151.

At openings in this protective film 151 is exposed metal wiring 161 as shown by reference 135 as exposed regions.

In regions where protective film 151 exists, metal wiring 161 is covered with protective film 151 to form protected regions shown by reference 131.

Referring to FIG. 5(b), two exposed regions 135 of one board piece 101a among these board pieces 101a, 101b, 101c are opposed to exposed regions 135 of the other two board pieces 101b, 10c. Metal wiring 161 of the one board piece 101a is brought into contact with metal wirings 161 of the other board pieces 101b, 101c (low-melting coatings 125 on the surfaces of metal wirings 161 are brought into contact with each other) and heat and pressure are applied so that thermoplastic resin film 115 first softens and thermoplastic resin film 115 below the bottom of pressed metal wiring 161 softens and enters into the gap between metal wirings 161. As a result, the gap between metal wirings 161 is filled with the thermoplastic resin.

As the temperature of metal wirings 161 further rises in this state, low-melting metal coatings 125 on the surfaces of copper thin films 121 melt. However, melts of low-melting metal coatings 125 cannot scatter so that no short circuit occurs between metal wirings 161 because the thermoplastic resin of thermoplastic resin films 115 is filled between metal wirings 161.

Referring to FIG. 5(c), low-melting metal coatings 125 melt and then solidify into one piece when cooled. Reference 119 represents a low-melting metal coating as one piece. Metal wirings 161 are electrically and mechanically connected via the resulting one piece low-melting metal coating 119 to form a connection 141. Non-thermoplastic resin films 111 of board pieces 101a, 101b, 101c opposed to each other are also connected to each other via thermoplastic resin films 115.

Thus, board pieces 101a, 101b, 101c are firmly connected via connections 141 of metal wirings 161 and thermoplastic resin films 115 to give a flexible wiring board 105 (FIG. 5(c)).

FIG. 5(d) shows an end region of board pieces 101b, 101c where connection 141 is not formed among exposed regions 135 of board pieces 101b, 101c. In this region, metal wiring 161 is exposed and used as an external terminal 145 for connecting flexible wiring board 105 to an outer circuit.

In this flexible wiring board 105, protective film 151 is provided on metal wiring 161 except for connection 141 or external terminal 145 to form protected region 131.

Next, a fourth example of flexible wiring board of the present invention is explained.

Figure 6A:
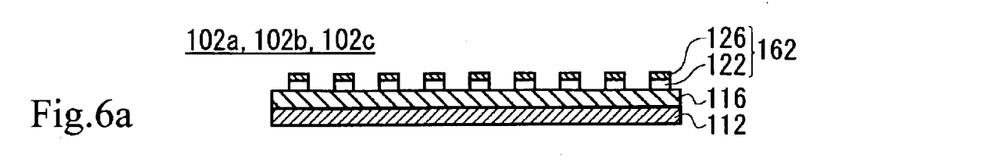
Figure 6B:
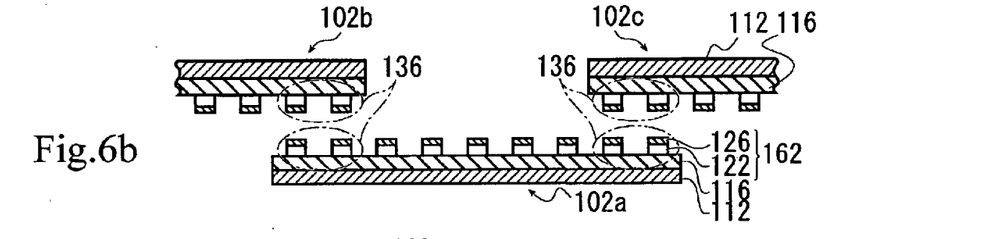
Figure 6C:
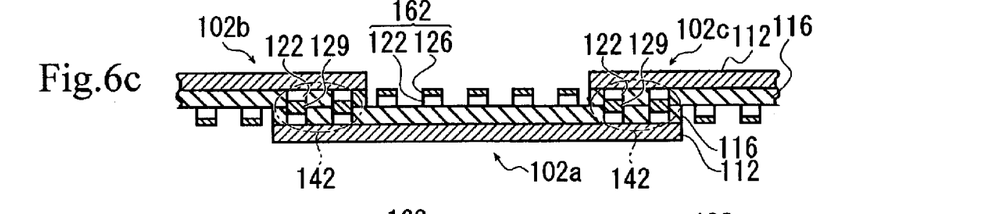
Figure 6D:
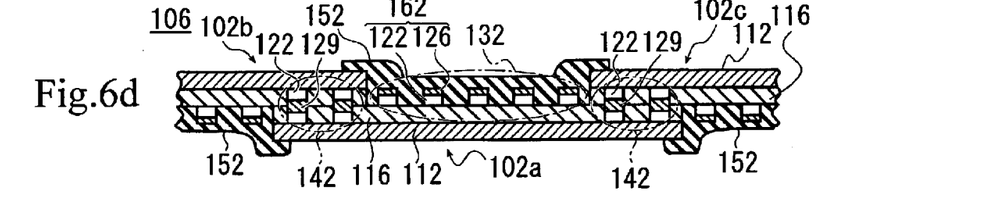
Figure 6E:
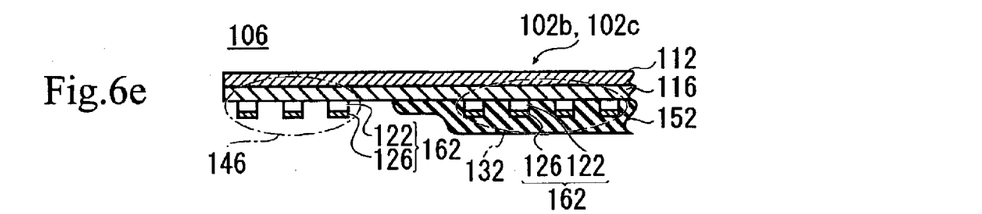

Referring to FIG. 6(a), reference 102a, 102b, 102c represent board pieces used for preparing a fourth example of flexible wiring board 106 of the present invention (flexible wiring board represented by reference 106 in FIGS. 6(d), (e)).

This board piece 102a, 102b, 102c has a multilayer resin film consisting of a non-thermoplastic resin film 112 and a thermoplastic resin film 116 formed on the surface thereof. On the top of the thermoplastic resin film 116 is formed a patterned metal wiring 162. Metal wiring 162 consists of a copper thin film 122 and a low-melting metal coating 126 formed on the surface thereof.

Unlike board pieces 101a, 101b, 101c of the above third example, each board piece 102a, 102b, 102c has no protective film on metal wiring 62.

Referring to FIG. 6(b), some of exposed regions 136 of metal wiring 162 of one board piece 102a among board pieces 102a, 102b, 102c is opposed to exposed regions 136 of the other two board pieces 102b, 102c.

Metal wirings 162 in the exposed regions 136 are brought into contact with each other and heat and pressure are applied so that thermoplastic resin films 116 first soften and flow out from the bottoms of pressed metal wirings 162 and the gap between metal wirings 162 is filled with the thermoplastic resin. Then, low-melting metal coatings 122 melt without scattering, and board pieces 102a, 102b, 102c are cooled to form a connection 142 at which metal wirings 162 are connected and fixed to each other. This state is shown in FIG. 6(c). In this figure, reference 129 represents a low-melting metal coating formed by melting and solidifying two low-melting metal coatings 122.

After connection 142 is formed, a resin material is applied on metal wirings 162 exposed at the surface and opened at desired parts by exposure and development and then baked to form a patterned protective film 152. The region where this protective film 152 is formed constitutes protected region 132 of exposed metal wiring 62 to give a flexible wiring board 106 with no metal wiring 162 exposed at undesired parts (FIG. 6(d)).

During patterning protective film 152, metal wiring 162 used for connection to outer circuits remains exposed to form an external terminal 146 as shown in FIG. 6(e).

This flexible wiring board 106 is also formed by assembling a plurality of board pieces 102a, 102b, 102c via low-melting metal coatings 126 and thermoplastic resin films 116, and protected by protective film 152 or non-thermoplastic resin film 112 except for external terminal 146 of metal wiring 162.

Next, a fifth example of flexible wiring board of the present invention is explained.

Figure 7A:
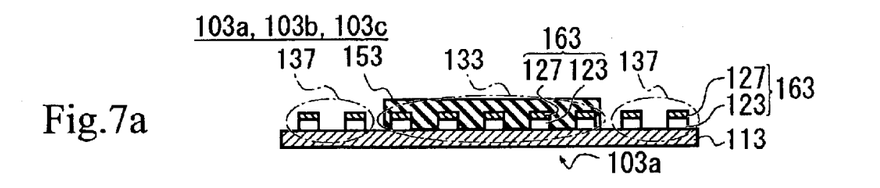
Figure 7B:
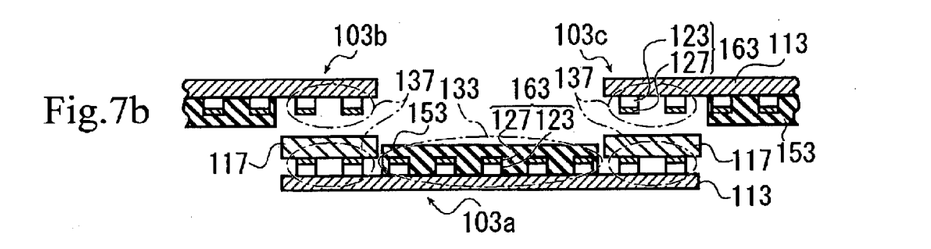
Figure 7C:
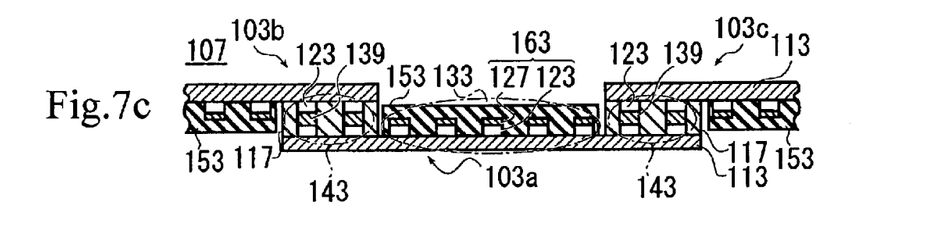
Figure 7D:
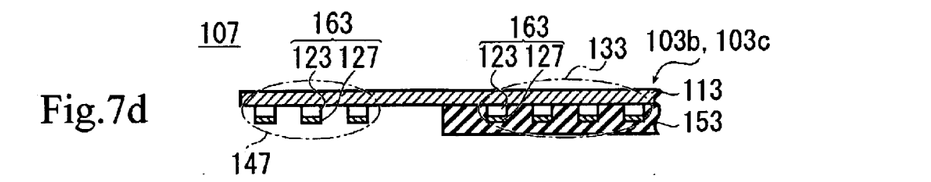

Referring to FIG. 7(a), references 103a, 103b, 103c represent board pieces used for preparing a fifth example of flexible wiring board (flexible wiring board represented by reference 107 in FIG. 7(c), 7(d)) and having a non-thermoplastic resin film 113. On the top of the non-thermoplastic resin film 113 is formed a patterned metal wiring 163.

Metal wiring 163 consists of a copper thin film 123 and a low-melting metal coating 127 formed on the surface thereof, and has a patterned protective film 153 formed on the surface thereof.

Openings in protective film 153 form exposed regions 137, while metal wiring 163 is not exposed at the surface in protected regions 133 where protective film 153 exists. Exposed regions 137 are used for connecting board pieces 103a, 103b, 103c to each other or to outer circuits as described later.

A thermoplastic resin film 117 is applied on some of exposed regions 137 of one board piece 103a among these board pieces 103a, 103b, 103c, and then exposed regions 137 of the other two board pieces 103b, 103c are opposed to the thermoplastic resin film 117 (FIG. 7(b)).

Then, metal wirings 161 of board pieces 103a, 103b, 103c are brought into contact with each other via thermoplastic resin film 117 and heat and pressure are applied so that thermoplastic resin film 117 first softens to fill the gap between metal wirings 163.

During then, thermoplastic resin film 117 flows out from the gap between two metal wirings 163 pressed against each other and metal wirings 163 come into direct contact with each other. As the temperature of metal wirings 163 rises in this state, low-melting metal coatings 127 melt without scattering, and low-melting metal coatings 127 combine when cooled. Reference 139 represents the resulting single layer low-melting metal coating. Metal wirings 163 are electrically and mechanically connected via the low-melting metal coating 139. Reference 143 represents a connection formed by low-melting metal coating 139 and metal wirings 163.

Board pieces 103a, 103b, 103c are firmly connected via connection 143 and thermoplastic resin film 117 to give a flexible wiring board 107 (FIG. 7(c)).

In exposed regions 137 of board pieces 103b, 103c other than connection 143, metal wiring 163 remains exposed to form an external terminal 147 for connecting this flexible wiring board to an outer circuit (FIG. 7(d)).

Next, a sixth example of flexible wiring board of the present invention is explained.

Figure 8A:
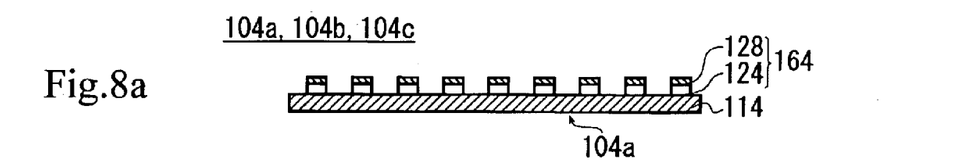
Figure 8B:
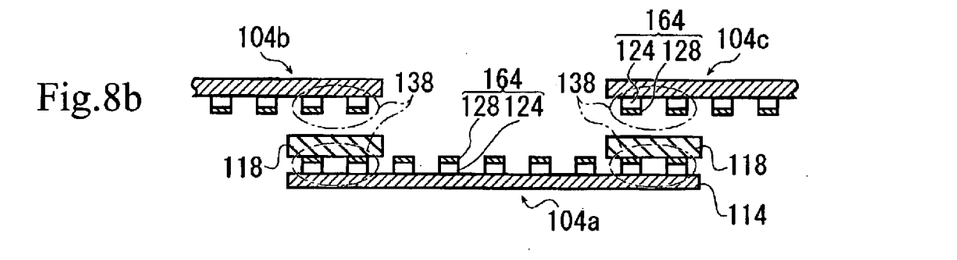
Figure 8C:
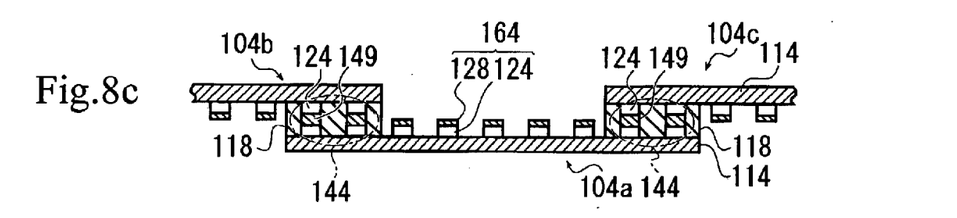
Figure 8D:
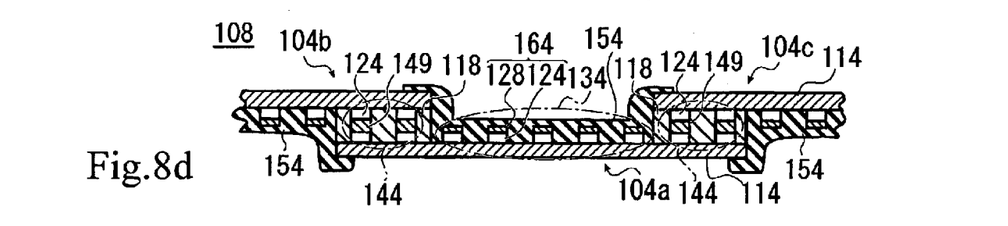
Figure 8E:
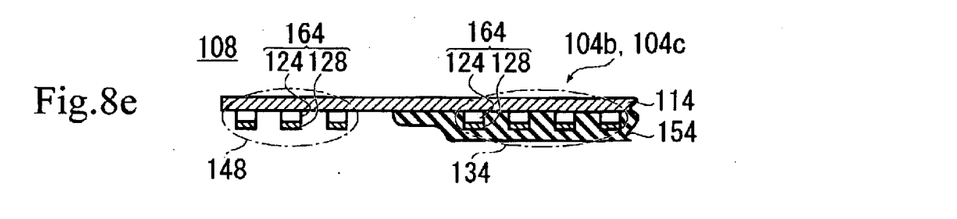

Referring to FIG. 8(a), references 104a, 104b, 104c represent board pieces used for preparing a sixth example of flexible wiring board (flexible wiring board represented by reference 108 in FIGS. 8(d), (e)). Each board piece 104a, 104b, 104c has a non-thermoplastic resin film 114 and a patterned metal wiring 164 formed on the non-thermoplastic resin film 114. This metal wiring 164 consists of a copper thin film 124 and a low-melting metal coating 128 formed on the surface thereof.

Each board piece 104a, 104b, 104c has no protective film and metal wiring 164 is exposed at the surface. A thermoplastic resin film 118 is applied on some of exposed regions 138 of one board piece 104a, and opposed to exposed regions 138 of the other two board pieces 104b, 104c (FIG. 8(b)).

Then, metal wirings 164 in the exposed regions 138 are brought into contact with each other and heat and pressure are applied so that thermoplastic resin film 118 softens and then low-melting metal coatings 128 melt without scattering to form a connection 144 at which metal wirings 164 are connected (FIG. 8(c)). Reference 149 in this figure represents a low-melting metal coating formed by combining two low-melting metal coatings 128.

Then, a patterned protective film 154 is formed on the top of exposed copper thin film 164 to give a flexible wiring board 108 with no copper thin film 164 exposed at undesired parts (FIG. 8(d)). The surface of metal wiring 164 is exposed at openings in protective film 154 to form an external terminal 148 used for connection with outer circuits (FIG. 8(e)).

As described above, flexible wiring boards 105–108 of the present invention have high strength because copper thin films 161–164 are protected by non-thermoplastic resin films 111–114 or protective films 151–154 except for regions of external terminals 145–148 and board pieces 101–104 are firmly connected via connections 141–144 and thermoplastic resin films 115–118, and they can be produced with high yields because low-melting metals 125–128 cannot scatter so that no short circuit occurs between metal wirings 161–164.

Although the foregoing description relates to assembling board pieces of the same type 103–106, a board piece 101a having a metal wiring 161 formed on a thermoplastic resin film 115 as shown in FIG. 5(a) and board pieces 103b, 103c having a metal wiring 163 formed on a non-thermoplastic resin film 113 as shown in FIG. 7 (a) may also be assembled, for example. In this case, thermoplastic resin film 117 need not be applied on metal wiring 163 if thermoplastic resin film 115 has a large thickness.

Although the foregoing description relates to assembling three board pieces, the present invention is not limited thereto but widely includes flexible wiring boards formed by assembling a plurality of board pieces such as assembling two or four or more elements or layering three or more elements.

Flexible wiring boards 105–108 of the present invention are highly reliable and especially suitable for flexible wiring boards having a relative large area and a complex shape formed by assembling three or more board pieces because they have protective films 151–154 and metal wirings 161–164 are exposed only at regions required to be exposed (such as external terminals 145–148).

Although solders are suitable for the above low-melting metal coating 125, the present invention is not limited thereto but metals and metal alloys having a melting temperature which is higher than the softening temperatures of thermoplastic resin films but not extremely high can be widely used. Low-melting metal coatings 125–128 need not be exposed at the surface, but a gold thin film or the like may be formed for preventing oxidation without any influence on melting and solidifying low-melting metal coatings 125–128 to give a flexible wiring board by assembling board pieces.

Low-melting metal coatings 125–128 need not be formed over the whole region of metal wirings 161–164, but may be formed on at least regions forming connections 141–144.

Low-melting metal coatings 125–128 need not be formed on both of copper thin films 121–124 to be connected to each other, but one of metal wirings 161–164 to be connected to each other may have a low-melting metal coating 125–128.

Flexible wiring boards can also be obtained without necessarily having a low-melting metal coating. When thermoplastic resin films 117, 118 applied on metal wirings 163, 164 have anisotropic conductivity, flexible wiring boards 107, 108 can be obtained only by bonding board pieces 103, 104 under thermal compression without melting and solidifying low-melting metal coatings 127, 128.

As described above, when board pieces of the present invention using a low-melting metal coating are assembled to prepare a flexible wiring board, no melt scatters and no short circuit occurs because thermoplastic resin films soften and fill the gap between metal wirings before the low-melting metal melts.

Thermoplastic resin films used in board pieces and flexible wiring boards of the present invention develop adhesiveness when they soften and return to the original state when they are cooled, whereby non-thermoplastic resin films of board pieces are adhered to each other via the thermoplastic resin films. As a result, the board pieces are assembled via the thermoplastic resin films.

Metal wirings of flexible wiring boards of the present invention should be connected to semiconductor chips or electronic circuits.

Therefore, metal wirings can be partially exposed on flexible wiring boards to serve as external terminals used for connecting flexible wiring boards to outer circuits.

Regions of metal wirings neither located in assembled board pieces nor forming external terminals can be covered with a protective film. Thus, flexible wiring boards have high reliability and durability because metal wirings are protected by non-thermoplastic resin films or protective films.

In this case, two flexible boards can be electrically connected by bonding the flexible boards under thermal compression while metal wirings of the flexible boards are in contact with each other and partially exposed.

When a low-melting metal coating is formed on the metal wiring of at least one of two flexible boards to be assembled and the flexible boards are bonded under thermal compression, the low-melting metal coating melts and then solidify by cooling to form a metallic bond between the metal wiring and the low-melting metal coating, whereby the metal wirings are electrically and mechanically firmly connected via the low-melting metal coating.

However, there is no danger of solder metals or the like scattering when metal wirings are ultrasonically connected and then board pieces are assembled.

When two flexible boards are to be assembled, both flexible boards may have a metal wiring formed on a thermoplastic resin film, but either one flexible board may have a metal wiring formed on a thermoplastic resin film depending on the thickness of the thermoplastic resin film and the area and pitch of the part of the metal wiring used for assembling.

INDUSTRIAL APPLICABILITY

Flexible wiring boards having a complex shape can be obtained by assembling board pieces having a simple shape.

Flexible wiring boards of the present invention are suitable for electronic circuits because of the high reliability and durability.

What is claimed is:

1. A process for manufacturing a flexible wiring board by assembling a plurality of board pieces having a resin film and a metal wiring provided on the resin film, comprising:

providing a thermoplastic resin film between the metal wirings of the board pieces to be assembled to each other, and connecting the metal wirings of the board pieces to each other by pressing the board pieces against each other under heat to force the metal wirings into the thermoplastic resin film.

2. The process for manufacturing a flexible wiring board according to claim 1, further comprising:

providing a protective film on a part of a surface of a board piece to be assembled to cover a part of the metal wiring before assembling the board pieces, wherein the thermoplastic resin film is provided on a region not covered by the protective film, and the board pieces are as assembled to each other.

3. The process for manufacturing a flexible wiring board according to claim 2, further comprising:

forming a low-melting metal coating on a surface of the metal wiring of at least one of the board pieces to be assembled, melting the low-melting metal coating forced into the thermoplastic resin film while the board pieces are heated under pressure, and solidifying the low-melting metal coating to connect the metal wirings to each other.

4. The process for manufacturing a flexible wiring board according to claim 1, further comprising:

exposing a region of the metal wiring of at least one board piece when the board pieces are assembled to each other, and providing a protective film on the exposed region after the board pieces are assembled each other.

5. The process for manufacturing a flexible wiring board according to claim 4, wherein at least a part of the metal wiring on the exposed region is not covered by the protective film.

6. The process for manufacturing a flexible wiring board according to claim 4, further comprising:

protruding a first board piece from second board piece to be assembled to each other before assembling, and providing a protective film on the board pieces, wherein the protective film is arranged to extend across the first board piece to the second board piece.

7. The process for manufacturing a flexible wiring board according to claim 4, further comprising:

forming a low-melting metal coating on a surface of the metal wiring of at least one of the board pieces to be assembled, melting the low-melting metal coating forced into the thermoplastic resin film while the board pieces are heated under pressure, and solidifying the low-melting metal coating to connect the metal wirings each other.

8. The process for manufacturing a flexible wiring board according to claim 1, further comprising:

adhering a surface of a first board piece and a surface of a second board piece to a same surface side of a third board piece.

9. The process for manufacturing a flexible wiring board according to claim 8, further comprising:

providing a protective film partially on the adhering surfaces of the first, second, and third board pieces to partially cover the metal wirings of the first, second, and third board pieces before assembling, providing a thermoplastic resin film on an exposed region of each metal wiring, and adhering the first and second board pieces to the third board piece.

10. The process for manufacturing a flexible wiring board according to claim 8, further comprising:

providing a protective film on the metal wirings of the first, second, and third board pieces after adhering the first, second, and third board pieces.

11. The process for manufacturing a flexible wiring board according to claim 10, further comprising:

protruding the third board piece from the first and second board pieces before assembling, and providing a protective film on the board pieces, wherein the protective film is arranged to extend across the first and third board pieces.

12. The process for manufacturing a flexible wiring board according to claim 11, further comprising:

providing a second protective film on the first, second, and third board pieces, wherein the second protective film is arranged to extend across the second board piece to the third board piece.

13. A process for manufacturing a flexible wiring board by assembling at least a first board piece, a second board piece, and a third board piece, each having a resin film and a metal wiring provided on the resin film, comprising:

connecting and fixing a region of the metal wiring of the first board piece and a region of the metal wiring of the second board piece to the third board piece, filling thermoplastic resin in at least one space between the connecting and fixing regions of the metal wirings, and providing an exposed region and a covered region on the metal wirings except for the regions where the metal wirings of the first and the second board pieces are connected and fixed, wherein the exposed regions are covered with a protective film.

14. The process for manufacturing a flexible wiring board according to claim 13, further comprising:

providing a protective film on the third board piece on a surface having the connecting and fixing regions, wherein the protective film is not provided on the connecting and fixing regions.

15. The process for manufacturing a flexible wiring board according to claim 13, wherein the resin film of at least one of the first, second, and third board pieces has a structure laminating non-thermoplastic resin film and thermoplastic resin film, and the metal wiring is formed on the thermoplastic resin film.

16. The process for manufacturing a flexible wiring board according to claim 11, further comprising:

providing protective film on the board pieces, wherein the protective film is arranged to extend across the second and third board pieces.

* * * * *